US012733213B2

(12) United States Patent
Lee et al.

(10) Patent No.: US 12,733,213 B2
(45) Date of Patent: Sep. 8, 2026

(54) FIELD EFFECT TRANSISTOR WITH MULTI-LAYER METAL OXIDE SEMICONDUCTOR AND MULTI-LAYER METAL OXIDE GATE DIELECTRIC, AND INTEGRATED CIRCUIT DEVICE INCLUDING THE SAME

(71) Applicant: Samsung Electronics Co., Ltd., Suwon-si (KR)

(72) Inventors: Seunghee Lee, Suwon-si (KR); Yurim Kim, Suwon-si (KR); Teawon Kim, Suwon-si (KR); Yongsuk Tak, Suwon-si (KR); Seungwoo Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/236,623

(22) Filed: Aug. 22, 2023

(65) Prior Publication Data

US 2024/0079498 A1 Mar. 7, 2024

(30) Foreign Application Priority Data

Sep. 6, 2022 (KR) ........................ 10-2022-0112988

(51) Int. Cl.
*H10D 30/67* (2025.01)
*H10B 12/00* (2023.01)
(Continued)

(52) U.S. Cl.
CPC ....... *H10D 30/6755* (2025.01); *H10B 12/315* (2023.02); *H10B 12/482* (2023.02);
(Continued)

(58) Field of Classification Search
CPC ............. H10D 30/6755; H10D 62/102; H10D 62/124; H10D 86/423; H10B 12/315; H10B 12/482; H10B 12/488
See application file for complete search history.

(56) References Cited

U.S. PATENT DOCUMENTS 9,299,571 B2 * 3/2016 Liang .................. H10D 86/423
9,735,239 B2 8/2017 Doornbos et al.
(Continued)

FOREIGN PATENT DOCUMENTS

KR 102231372 B1 3/2021
KR 1020220013710 A 2/2022

*Primary Examiner* — Eliseo Ramos Feliciano
*Assistant Examiner* — Brad A Knudson
(74) *Attorney, Agent, or Firm* — Muir Patent Law, PLLC

(57) ABSTRACT

Provided is a field effect transistor including a gate electrode layer, an oxide semiconductor layer including gallium (Ga) and at least one metal element selected from indium (In) and zinc (Zn), and a dielectric layer between the gate electrode layer and the oxide semiconductor layer, wherein the oxide semiconductor layer includes a sub semiconductor layer in contact with the dielectric layer and a main semiconductor layer spaced apart from the dielectric layer with the sub semiconductor layer therebetween, the sub semiconductor layer has a first Ga content, and the first Ga content of the sub semiconductor layer is greater than contents of other metal elements included in the sub semiconductor layer and decreases as a distance from an interface of the sub semiconductor layer in contact with the dielectric layer increases.

20 Claims, 15 Drawing Sheets

(51) Int. Cl.
*H10D 62/10* (2025.01)
*H10D 86/40* (2025.01)

(52) U.S. Cl.
CPC ....... *H10B 12/488* (2023.02); *H10D 30/6728* (2025.01); *H10D 62/102* (2025.01); *H10D 62/124* (2025.01); *H10D 86/423* (2025.01)

(56) References Cited

U.S. PATENT DOCUMENTS

| | | | | |
|---|---|---|---|---|
| 10,790,396 | B2 | 9/2020 | Sawabe et al. | |
| 11,201,248 | B2 | 12/2021 | Lee et al. | |
| 11,282,833 | B2 | 3/2022 | Lee et al. | |
| 2011/0068384 | A1* | 3/2011 | Kim | H10B 12/482<br>257/302 |
| 2015/0076491 | A1* | 3/2015 | Yamazaki | H10D 30/6734<br>257/43 |
| 2017/0323975 | A1* | 11/2017 | Yamazaki | H10D 30/6733 |
| 2018/0122833 | A1* | 5/2018 | Lee | H10D 30/6757 |
| 2019/0296155 | A1* | 9/2019 | Sawabe | H10B 12/31 |
| 2020/0161294 | A1* | 5/2020 | Lee | H10D 86/441 |
| 2022/0037504 | A1* | 2/2022 | Sills | H10B 12/31 |
| 2022/0199830 | A1* | 6/2022 | Zhang | H10D 30/6755 |
| 2023/0320068 | A1* | 10/2023 | Kim | H10B 12/05<br>257/296 |
| 2024/0313121 | A1* | 9/2024 | Saito | H10D 30/6757 |

* cited by examiner

200c
SU
MU
MC
SCA
WL
WL
WL
BL
BL
BL
Z
Y
X

FIG. 7A 200c
460
410
PC
BL
422
WL
412
Z
Y
X

FIELD EFFECT TRANSISTOR WITH MULTI-LAYER METAL OXIDE SEMICONDUCTOR AND MULTI-LAYER METAL OXIDE GATE DIELECTRIC, AND INTEGRATED CIRCUIT DEVICE INCLUDING THE SAME

CROSS-REFERENCE TO RELATED APPLICATION

This application is based on and claims priority under 35 U.S.C. § 119 to Korean Patent Application No. 10-2022-0112988, filed on Sep. 6, 2022, in the Korean Intellectual Property Office, the disclosure of which is incorporated by reference herein in its entirety.

BACKGROUND

The inventive concept relates to a field effect transistor and an integrated circuit device including the same, and more particularly, to a field effect transistor including an indium gallium zinc oxide (IGZO) oxide semiconductor and an integrated circuit device including the same.

Recently, as the degree of integration of transistors gradually increases, various research has been conducted to reduce leakage current due to a short channel effect, and transistors using oxide semiconductors having low leakage current characteristics have been developed.

SUMMARY

The inventive concept provides a field effect transistor with improved reliability and an integrated circuit device including the same.

According to an aspect of the inventive concept, there is provided a field effect transistor. The field effect transistor includes a gate electrode layer, an oxide semiconductor layer including gallium (Ga) and at least one metal element selected from indium (In) and zinc (Zn), and a dielectric layer between the gate electrode layer and the oxide semiconductor layer, wherein the oxide semiconductor layer includes a sub semiconductor layer in contact with the dielectric layer and a main semiconductor layer spaced apart from the dielectric layer with the sub semiconductor layer therebetween, wherein the sub semiconductor layer has a first Ga content, and wherein the first Ga content of the sub semiconductor layer is greater than contents of other metal elements included in the sub semiconductor layer and decreases as a distance from an interface of the sub semiconductor layer in contact with the dielectric layer increases.

According to another aspect of the inventive concept, there is provided an integrated circuit device. The integrated circuit device includes a substrate having a plurality of active regions, transistor structures formed on the substrate and arranged in a plurality of word line trenches extending lengthwise in a first horizontal direction parallel to a top surface of the substrate, and a plurality of bit line structures formed on the substrate and extending lengthwise in a second horizontal direction, which is parallel to the top surface of the substrate and intersects with the first horizontal direction, wherein the transistor structure includes a gate electrode layer, an oxide semiconductor layer including gallium (Ga) and at least one metal element selected from indium (In) and zinc (Zn), and a dielectric layer between the gate electrode layer and the oxide semiconductor layer, wherein the oxide semiconductor layer includes a sub semiconductor layer, which is in contact with the dielectric layer and has a first Ga content, and a main semiconductor layer, which is spaced apart from the dielectric layer with the sub semiconductor layer therebetween and has a second Ga content, and wherein the first Ga content is greater than contents of other metal elements included in the sub semiconductor layer and decreases as a distance from an interface of the sub semiconductor layer in contact with the dielectric layer increases.

According to another aspect of the inventive concept, there is provided an integrated circuit device. The integrated circuit device includes a bit line extending in a first horizontal direction on a substrate, a word line extending in a second horizontal direction crossing the first horizontal direction over the bit line, an oxide semiconductor layer comprising gallium (Ga) and at least one metal element selected from indium (In) and zinc (Zn), extending in a vertical direction over the bit line, and spaced apart from the word line with a dielectric layer therebetween, a landing pad disposed on the oxide semiconductor layer, and a capacitor structure disposed on the landing pad, wherein the dielectric layer includes a sub dielectric layer in contact with the oxide semiconductor layer and a main dielectric layer in contact with the word line, wherein the oxide semiconductor layer includes a sub semiconductor layer, which is in contact with the sub dielectric layer, and a main semiconductor layer, which surrounds the sub semiconductor layer and is in contact with the bit line, wherein the sub semiconductor layer has a first Ga content and the main semiconductor layer has a second Ga content, and wherein the first Ga content of the sub semiconductor layer is greater than contents of other metal elements included in the sub semiconductor layer and decreases as a distance from an interface of the sub semiconductor layer in contact with the dielectric layer increases.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings:

FIG. 7A is a perspective view of an integrated circuit device according to example embodiments;

DETAILED DESCRIPTION OF THE EMBODIMENTS

Figure 1A:
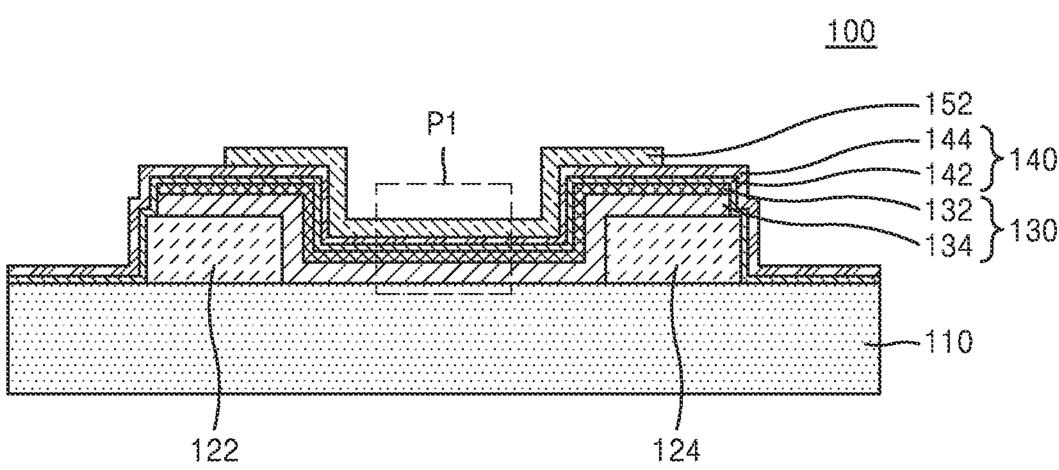
FIG. 1A is a schematic cross-sectional view of a field effect transistor according to example embodiments.
Figure 1B:
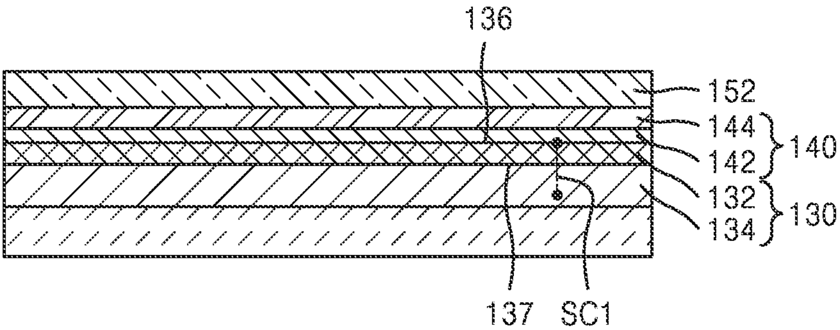
FIG. 1B is an enlarged view of a region P1 in FIG. 1A.
Figure 2A:
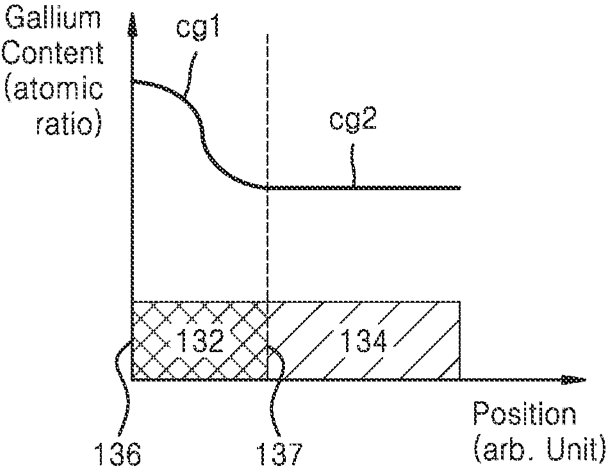
FIG. 2A is a graph schematically showing gallium (Ga) contents along a scan line SC1 of FIG. 1B.
Figure 2B:
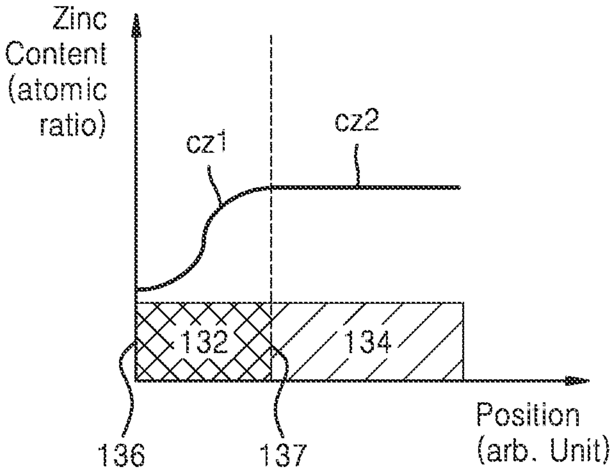
FIG. 2B is a graph schematically showing zinc (Zn) contents along the scan line SC1 of FIG. 1B.

FIG. 1A is a schematic cross-sectional view of a field effect transistor 100 according to example embodiments. FIG. 1B is an enlarged view of a region P1 in FIG. 1A. FIG. 2A is a graph schematically showing gallium (Ga) contents along a scan line SC1 of FIG. 1B. FIG. 2B is a graph schematically showing zinc (Zn) contents along the scan line SC1 of FIG. 1B.

Referring to FIGS. 1A, 1B, 2A, and 2B, a first source/drain structure 122 and a second source/drain structure 124 may be arranged on a substrate 110 to be spaced apart from each other. According to embodiments, a semiconductor layer 130 may contact the first source/drain structure 122 and the second source/drain structure 124. For example, the semiconductor layer 130 may contact side and top surfaces of the first source/drain structure 122 and the second source/drain structure 124. For example, the semiconductor layer 130 may be disposed between the first source/drain structure 122 and the second source/drain structure 124. For example, the semiconductor layer 130 on the substrate 110 may cover both the first source/drain structure 122 and the second source/drain structure 124. The term "contact," as used herein, refers to a direct connection (i.e., touching) unless the context indicates otherwise.

According to example embodiments, a dielectric layer 140 may be disposed on the semiconductor layer 130, and a gate electrode layer 152 may be disposed on the dielectric layer 140. For example, dielectric layer 140 may be disposed between a gate electrode layer 152 and the semiconductor layer 130. For example, the semiconductor layer 130 may be spaced apart from the gate electrode layer 152 with the dielectric layer 140 therebetween. According to example embodiments, the dielectric layer 140 may cover all of the semiconductor layer 130, the first source/drain structure 122, and the second source/drain structure 124. For example, the dielectric layer 140 may contact a top surface of the semiconductor layer 130, portions of the top surfaces of the first source/drain structure 122 and the second source/drain structure 124, and side surfaces of the first source/drain structure 122 and the second source/drain structure 124. The gate electrode layer 152 may contact a portion of the top surfaces of the dielectric layer 140.

According to some embodiments, the substrate 110 may include a glass material, a metal material, or a plastic material like polyethylene terephthalate (PET), polyethylene naphthalate (PEN), or polyimide. According to some other embodiments, the substrate 110 may include Si, Ge, or a semiconductor material like SiGe, SiC, GaAs, InAs, or InP.

According to embodiments, the first source/drain structure 122 and the second source/drain structure 124 may include a conductive material. According to some embodiments, the first source/drain structure 122 and the second source/drain structure 124 may each include at least one of W, WN, TiN, and TaN. According to some other embodiments, the first source/drain structure 122 and the second source/drain structure 124 may each include doped polysilicon.

According to embodiments, the semiconductor layer 130 may include an oxide semiconductor material including at least one metal element selected from indium (In), Ga, and Zn. For example, the semiconductor layer 130 may include an amorphous semiconductor composed of oxygen (O) and at least one metal element from among In, Ga, and Zn.

According to embodiments, the dielectric layer 140 may include at least one selected from among silicon oxide, silicon nitride, silicon oxynitride, oxide/nitride/oxide (ONO), and a high-k dielectric material having a higher dielectric constant than silicon oxide. The high-k dielectric material may include at least one selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). The terms "HfO", "ZrO", "LaO", "TiO", "LaO", or "YO" as used herein refer to a material composed of elements included in each term and is not a formula representing a stoichiometric relationship.

According to embodiments, the semiconductor layer 130 may include a sub semiconductor layer 132 in contact with the dielectric layer 140 and a main semiconductor layer 134 spaced apart from the dielectric layer 140 with the sub semiconductor layer 132 therebetween. According to embodiments, the sub semiconductor layer 132 may include a first surface 136 and a second surface 137 that face each other. For example, the dielectric layer 140 may be disposed on the first surface 136 of the sub semiconductor layer 132, and the main semiconductor layer 134 may be disposed on the second surface 137 of the sub semiconductor layer 132. For example, the first surface 136 may be an interface of the sub semiconductor layer 132 in contact with the dielectric layer 140, and the second surface 137 may be an interface of the sub semiconductor layer 132 in contact with the main semiconductor layer 134.

FIGS. 2A and 2B schematically show Ga contents and Zn contents in the sub semiconductor layer 132 and the main semiconductor layer 134 measured along the scan line SC1 of FIG. 1B. Ga contents and Zn contents are not limited to those shown in FIGS. 2A and 2B in relative size or scale. The Ga contents and the Zn contents may be measured by analysis equipment capable of analyzing elemental contents, e.g., an energy dispersive X-ray spectroscopy (EDX). In this specification, the content of any element may refer to an atomic ratio.

According to embodiments, the Ga content in the sub semiconductor layer 132 may be greater than contents of other metal elements included in the sub semiconductor layer 132. For example, the Ga content in the sub semiconductor layer 132 may be greater than a content of each of other metal elements included in the sub semiconductor layer 132. According to embodiments, the ratio of the Ga content with respect to the total metal element contents included in the sub semiconductor layer 132 may be from about 0.4 to about 0.8 and may preferably be from about 0.5 to about 0.7. Here, the content of a metal element included in the sub semiconductor layer 132 may refer to an average content with respect to the thickness of the sub semiconductor layer 132.

When the dielectric layer 140 includes an oxide and a difference between the bond dissociation energy between a metal element and oxygen (i.e., metal-oxygen (M-O) bond dissociation energy) constituting the semiconductor layer 130 and the bond dissociation energy between an arbitrary metal/metalloid element and oxygen constituting the dielectric layer 140 is large, interlayer movement of oxygen atoms may occur. For example, the bond dissociation energy between a metal element constituting the semiconductor layer 130 and oxygen may be less than the bond dissociation energy between any metal/metalloid element constituting the dielectric layer 140 and oxygen, and, when the difference between bond dissociation energies is large, oxygen atoms of the semiconductor layer 130 may move to the dielectric layer 140, and thus, oxygen vacancy may be formed in the semiconductor layer 130.

The field effect transistor 100 according to embodiments includes a sub semiconductor layer 132 having a relatively high Ga content and disposed directly on the bottom surface of the dielectric layer 140, and thus formation of oxygen vacancy in the semiconductor layer 130 may be suppressed. Therefore, electrical stability and reliability of the field effect transistor 100 may be improved.

According to embodiments, the Ga content of the sub semiconductor layer 132 may vary according to the thickness thereof within the sub semiconductor layer 132. According to embodiments, the sub semiconductor layer 132 may have a structure in which a plurality of unit sub semiconductor layers parallel to the first surface 136 are stacked in a direction perpendicular to the first surface 136. The plurality of unit sub semiconductor layers may be sequentially formed through an atomic layer deposition (ALD) process, a chemical vapor deposition (CVD) process, a physical vapor deposition (PVD) process, a plasma enhanced CVD (PECVD) process, a low pressure CVD (LPCVD) process, etc. For example, the plurality of unit sub semiconductor layers parallel to the first surface 136 may have a homogeneous composition. For example, the plurality of unit sub semiconductor layers stacked in a direction perpendicular to the first surface 136 may have different compositions from one another. For example, inside the sub semiconductor layer 132, the Ga content of a unit sub semiconductor layer close to the first surface 136 and the Ga content of a unit sub semiconductor layer close to the second surface 137 may be different from each other.

According to embodiments, the Ga content in the sub semiconductor layer 132 may decrease as the distance from the first surface 136 increases. Although FIG. 2A shows that the Ga content profile cg1 of the sub semiconductor layer 132 has an S-curved shape and gradually decreases as the distance from the first surface 136 increases, the inventive concept is not limited thereto. For example, the Ga content profile cg1 of the sub semiconductor layer 132 may have a linear shape and may also have a slope different from that shown in FIG. 2A. For example, the Ga content profile cg1 of the sub semiconductor layer 132 may intermittently decrease in a direction away from the first surface 136.

According to embodiments, the Ga content of the main semiconductor layer 134 may be lower than that of the sub semiconductor layer 132. For example, in FIG. 2A, the average value of the Ga content profile cg1 of the sub semiconductor layer 132 with respect to the thickness of the sub semiconductor layer 132 may be greater than the average value of the Ga content profile cg2 of the main semiconductor layer 134 with respect to the thickness of the main semiconductor layer 134. For example, as shown in the Ga content profile cg2 of the main semiconductor layer 134 shown in FIG. 2A, the Ga content in the main semiconductor layer 134 may be substantially constant regardless of the thickness of the main semiconductor layer 134. For example, the Ga content in the main semiconductor layer 134 may be substantially constant in a thickness direction of the main semiconductor layer 134.

According to embodiments, the Zn content in the sub semiconductor layer 132 may be less than contents of other metal elements included in the sub semiconductor layer 132. For example, the Zn content in the sub semiconductor layer 132 may be less than a content of each of other metal elements included in the sub semiconductor layer 132. According to embodiments, the sub semiconductor layer 132 may not include Zn. For example, the sub semiconductor layer 132 may include an indium gallium oxide semiconductor. According to embodiments, the ratio of the Zn content with respect to the total metal element contents included in the sub semiconductor layer 132 may be from 0 to about 0.3 and may preferably be from 0 to about 0.2. According to embodiments, the ratio of the In content with respect to the total metal element contents included in the sub semiconductor layer 132 may be from about 0.2 to about 0.4. Therefore, formation of oxygen vacancy in the semiconductor layer 130 may be suppressed, and thus stability and reliability of the field effect transistor 100 may be improved.

According to embodiments, the Zn content in the sub semiconductor layer 132 may increase as the distance from the first surface 136 increases. Although FIG. 2B shows that the Zn content profile cz1 of the sub semiconductor layer 132 has an S-curved shape and gradually increases as the distance from the first surface 136 increases, the inventive concept is not limited thereto. For example, the Zn content profile cz1 of the sub semiconductor layer 132 may have a linear shape and may also have a slope different from that shown in FIG. 2B. For example, the Zn content profile cz1 of the sub semiconductor layer 132 may intermittently increase in a direction away from the first surface 136.

According to embodiments, the Zn content of the main semiconductor layer 134 may be higher than that of the sub semiconductor layer 132. For example, in FIG. 2B, the average value of the Zn content profile cz1 of the sub semiconductor layer 132 with respect to the thickness of the sub semiconductor layer 132 may be less than the average value of the Zn content profile cz2 of the main semiconductor layer 134 with respect to the thickness of the main semiconductor layer 134. For example, as shown in the Zn content profile cz2 of the main semiconductor layer 134 shown in FIG. 2B, the Zn content in the main semiconductor layer 134 may be substantially constant regardless of the thickness of the main semiconductor layer 134. For example, the Zn content in the main semiconductor layer 134 may be substantially constant in the thickness direction of the main semiconductor layer 134.

According to embodiments, the main semiconductor layer 134 may have a homogeneous composition. For example, in the main semiconductor layer 134, different metal elements may have certain composition ratios regardless of the thickness of the main semiconductor layer 134.

According to embodiments, the ratio of the In content with respect to the total metal element contents included in the main semiconductor layer 134 may be from about 0.2 to about 0.4. According to embodiments, the ratio of the Ga content with respect to the total metal element contents included in the main semiconductor layer 134 may be from about 0.2 to about 0.4. According to embodiments, the ratio of the Zn content with respect to the total metal element contents included in the main semiconductor layer 134 may be from about 0.2 to about 0.4. According to some embodiments, In contents, Ga contents, and Zn contents of the main semiconductor layer 134 may be substantially the same. For example, In, Ga, and Zn may be included in the main semiconductor layer 134 in the ratio of 1:1:1.

According to embodiments, the dielectric layer 140 may include a sub dielectric layer 142 in contact with the sub semiconductor layer 132 on the first surface 136 and a main dielectric layer 144 spaced apart from the sub semiconductor layer 132 with the sub dielectric layer 142 therebetween. According to embodiments, at least one of the sub dielectric layer 142 and the main dielectric layer 144 may include a metal oxide or a metalloid oxide.

According to embodiments, the bond dissociation energy between a metal/metalloid element constituting the sub dielectric layer 142 and oxygen may be less than the bond dissociation energy between a metal/metalloid element constituting the main dielectric layer 144 and oxygen. According to embodiments, the bond dissociation energy between a metal/metalloid element constituting the sub dielectric layer 142 and oxygen may be greater than the bond dissociation energy between a metal element and oxygen constituting the sub semiconductor layer 132. According to embodiments, the sub dielectric layer 142 may be disposed between the sub semiconductor layer 132 and the main dielectric layer 144 to buffer movement of oxygen atoms.

According to embodiments, the sub dielectric layer 142 may include AlO. According to embodiments, the main dielectric layer 144 may include at least one selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), and lead scandium tantalum oxide (PbScTaO).

Figure 3:
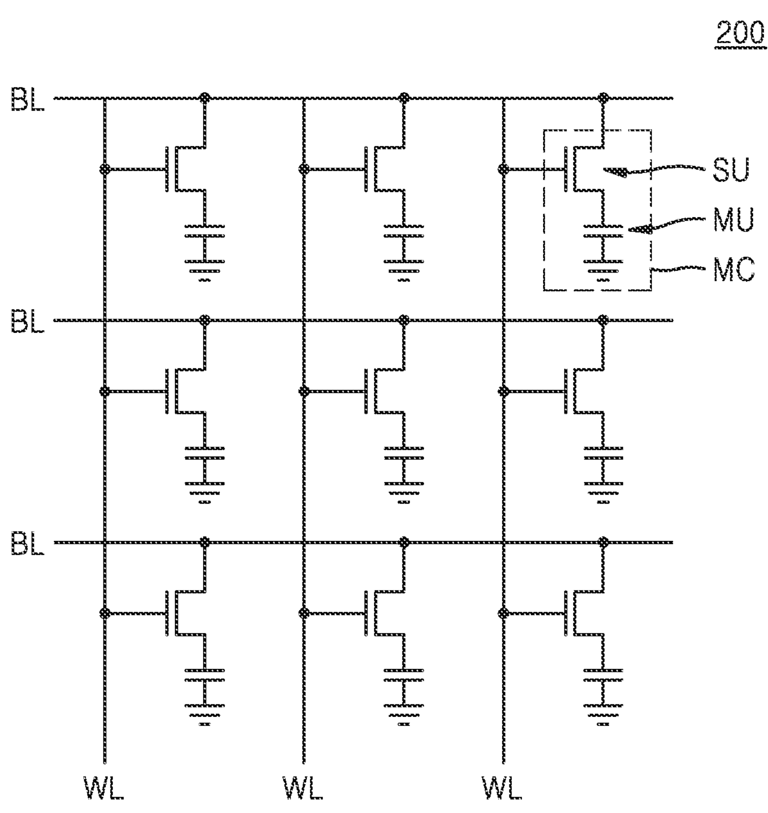
FIG. 3 is a schematic circuit diagram showing an integrated circuit device according to example embodiments.

FIG. 3 is a schematic circuit diagram showing an integrated circuit device 200 according to example embodiments. Referring to FIG. 3, the integrated circuit device 200 may include a memory cell array including a plurality of memory cells MC. The circuit diagram of the integrated circuit device 200 shown in FIG. 3 is only an example, and the inventive concept is not limited thereto.

According to embodiments, each memory cell MC may include a memory unit MU and a selection unit SU. According to embodiments, the memory unit MU may be configured to store data. For example, the memory unit MU may include a capacitor configured to store charges. For example, a lower electrode of the memory unit MU may be grounded, and an upper electrode of the memory unit MU may be connected to the selection unit SU.

According to embodiments, the selection unit SU may be configured to selectively control the movement of charges within the memory unit MU. According to embodiments, the selection unit SU may include the field effect transistor 100. According to embodiments, the selection unit SU may selectively connect a bit line BL to the memory unit MU by controlling the word line WL.

Figure 4A:
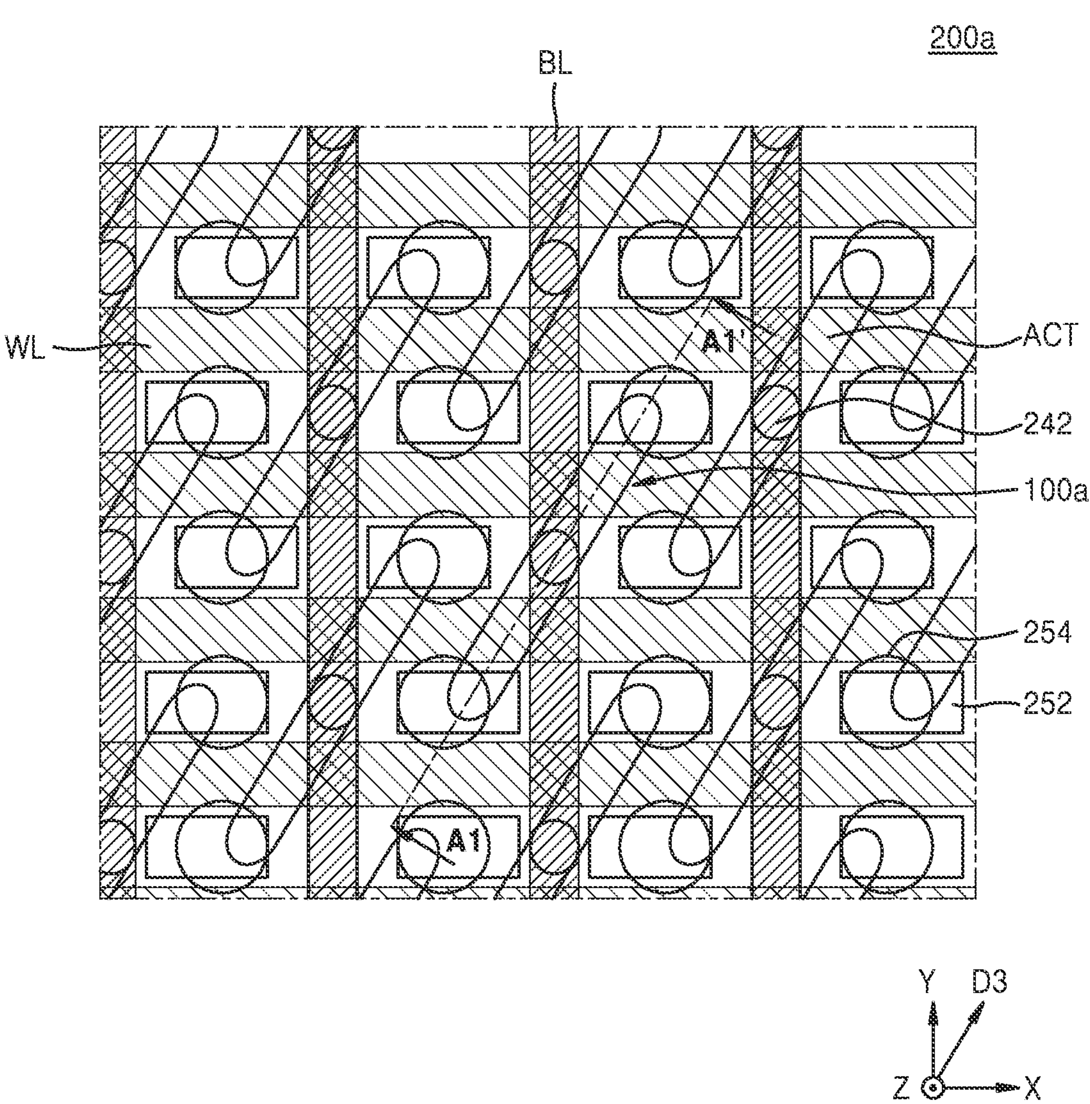
FIG. 4A is a layout diagram showing an integrated circuit device according to example embodiments.

FIG. 4A is a layout diagram showing a first integrated circuit device 200*a* according to example embodiments.

The first integrated circuit device 200*a* according to embodiments may include a first transistor structure 100*a*. According to embodiments, the first transistor structure 100*a* of the first integrated circuit device 200*a* may be a buried channel array transistor (BCAT). For example, the first transistor structure 100*a* may correspond to the field effect transistor 100 applied to the integrated circuit device 200.

Referring to FIG. 4A, a plurality of active regions ACT may be arranged in a third horizontal direction (D3 direction) that is an oblique direction with respect to a first horizontal direction (X direction) and a second horizontal direction (Y direction).

According to embodiments, a plurality of word lines WL may extend lengthwise in parallel to one another in the first horizontal direction (X direction) across the plurality of active regions ACT. According to embodiments, over the plurality of word lines WL, a plurality of bit lines BL may extend lengthwise in parallel to one another in the second horizontal direction (Y direction) crossing the first horizontal direction (X direction). According to embodiments, the plurality of bit lines BL may be connected to the plurality of active regions ACT through direct contacts 242, respectively.

According to embodiments, a plurality of first capacitor contacts 252 may be formed between two mutually adjacent bit lines BL from among the plurality of bit lines BL. According to embodiments, the plurality of first capacitor contacts 252 may be linearly arranged in the first horizontal direction (X direction) and the second horizontal direction (Y direction). According to embodiments, a plurality of first landing pads 254, which are conductive, may be formed on the plurality of first capacitor contacts 252, respectively. For example, the plurality of first landing pads 254 may at least partially overlap the plurality of first capacitor contacts 252 in a vertical direction (Z direction), respectively. According to embodiments, the plurality of first capacitor contacts 252 and the plurality of first landing pads 254 may connect first lower electrodes 262 (refer to FIG. 4B) of capacitors formed on the plurality of bit lines BL to the active regions ACT.

Figure 4B:
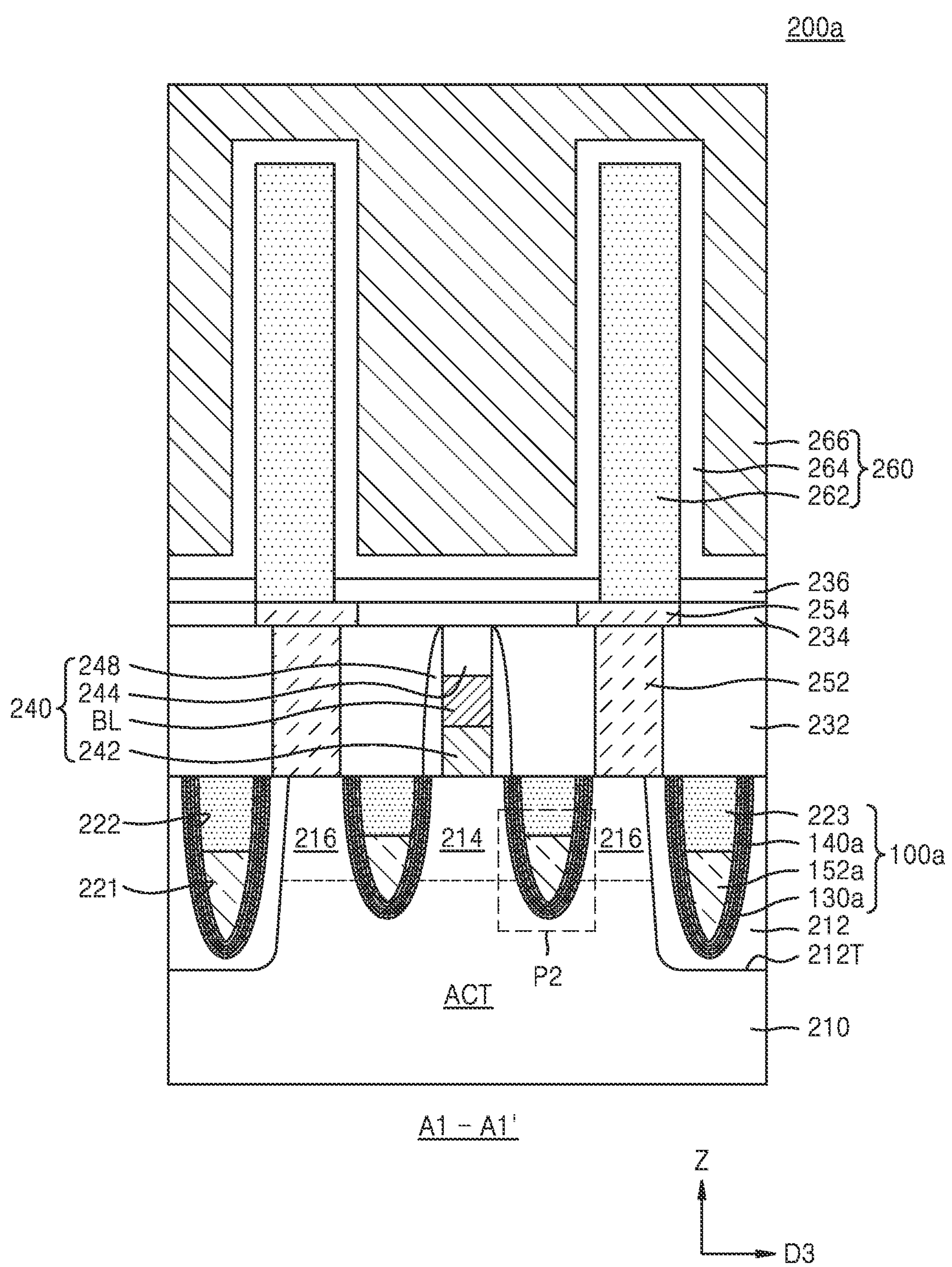
FIG. 4B is a cross-sectional view taken along a line A1-A1' of FIG. 4A.
Figure 4C:
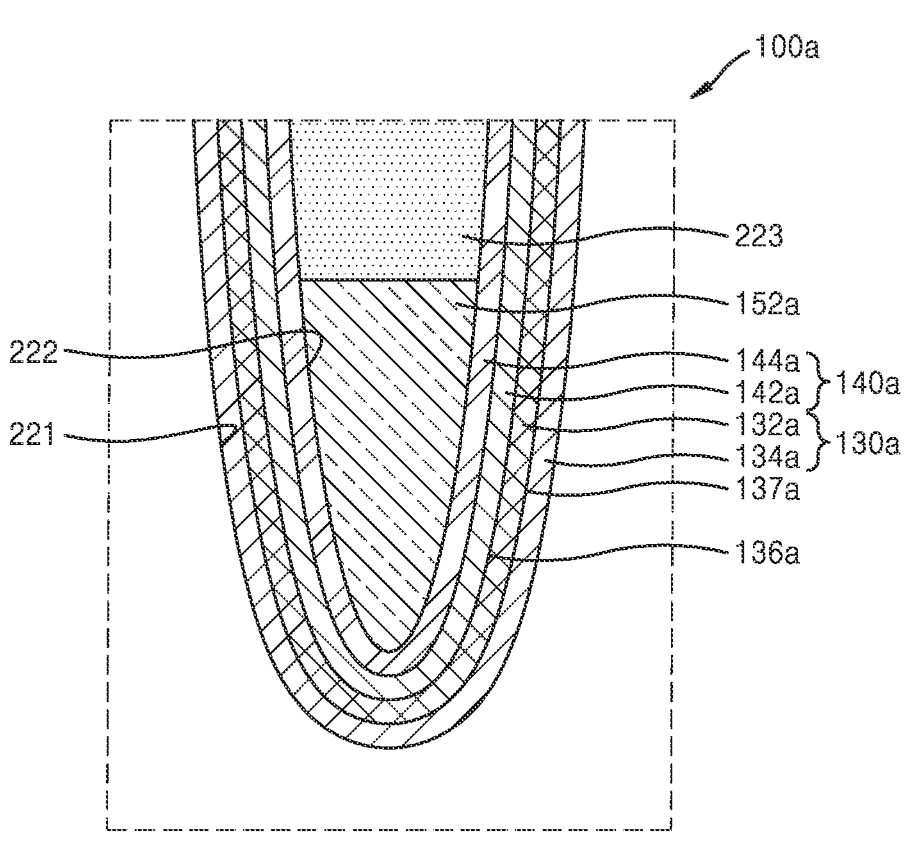
FIG. 4C is an enlarged view of a region P2 in FIG. 4B.

FIG. 4B is a cross-sectional view taken along a line A1-A1' of FIG. 4A. FIG. 4C is an enlarged view of a region P2 in FIG. 4B.

According to embodiments, the first integrated circuit device 200*a* may include a first semiconductor substrate 210 in which the plurality of active regions ACT are defined by a first device isolation layer 212. For example, the first device isolation layer 212 may be formed in a first device isolation trench 212T formed in the first semiconductor substrate 210.

According to embodiments, the first semiconductor substrate 210 may include Si, Ge, or a semiconductor material like SiGe, SiC, GaAs, InAs, or InP. According to embodiments, the first semiconductor substrate 210 may include a conductive region like a well doped with impurities or a structure doped with impurities. According to embodiments, the first device isolation layer 212 may include an oxide layer, a nitride layer, or a combination thereof.

According to embodiments, a plurality of first word line trenches 221 extending lengthwise in the first horizontal direction (X direction) may be formed in the first semiconductor substrate 210. A first transistor structure 100*a* may be formed in each of the plurality of first word line trenches 221. According to embodiments, the first transistor structure 100*a* may include a first semiconductor layer 130*a*, a first dielectric layer 140*a*, a first gate electrode layer 152*a*, and a first insulation capping layer 223.

According to embodiments, the first semiconductor layer 130*a* and the first dielectric layer 140*a* may be sequentially formed in a first word line trench 221. For example, the first semiconductor layer 130*a* may be disposed to conformally cover the inner wall of the first word line trench 221, and the first dielectric layer 140*a* may be formed on the first semiconductor layer 130*a* to form a second word line trench 222. According to embodiments, the first gate electrode layer 152*a* may be disposed in the second word line trench 222, and the first insulation capping layer 223 may be disposed on the first gate electrode layer 152*a*. For example, the first gate electrode layer 152*a* may correspond to the word line WL.

According to embodiments, the first insulation capping layer 223 may include silicon nitride.

According to embodiments, the first semiconductor layer 130*a* may include a first sub semiconductor layer 132*a* contacting the first dielectric layer 140*a* and a first main semiconductor layer 134*a* spaced apart from the first dielectric layer 140*a* with the first sub semiconductor layer 132*a* therebetween. According to embodiments, the first dielectric layer 140*a* may include a first sub dielectric layer 142*a* contacting the first sub semiconductor layer 132*a* and a first main dielectric layer 144*a* spaced apart from the first sub semiconductor layer 132*a* with the first sub dielectric layer 142*a* therebetween. According to embodiments, the first sub dielectric layer 142*a* may be disposed on a first surface 136*a* of the first sub semiconductor layer 132*a*, and the first main semiconductor layer 134*a* may be disposed on a second surface 137*a* of the first sub semiconductor layer 132*a*. For example, the first sub dielectric layer 142*a* may contact the first surface 136*a* of the first sub semiconductor layer 132*a*, and the first main semiconductor layer 134*a* may contact the second surface 137*a* of the first sub semiconductor layer 132*a*. According to embodiments, the first gate electrode layer 152*a* may be disposed on the first main dielectric layer 144*a*. For example, the first gate electrode layer 152*a* may contact the first main dielectric layer 144*a*.

According to embodiments, the first gate electrode layer 152*a*, the first main dielectric layer 144*a*, the first sub dielectric layer 142*a*, the first sub semiconductor layer 132*a*, and the first main semiconductor layer 134*a* of the first integrated circuit device 200*a* may correspond to the gate electrode layer 152, the main dielectric layer 144, the sub dielectric layer 142, the sub semiconductor layer 132, and the main semiconductor layer 134 of the field effect transistor 100, respectively.

According to embodiments, the plurality of first transistor structures 100*a* may penetrate through a portion of an active region ACT. According to embodiments, a first source/drain region 214 and a second source/drain region 216 defined by the plurality of first transistor structures 100*a* may be formed in an upper portion of the active region ACT. For example, the first source/drain region 214 and the second source/drain region 216 may be impurity regions doped with impurities having a conductivity type that is different from that of the impurities the active region ACT is doped with. N-type or P-type impurities may be independently arranged in each of the first source/drain region 214 and the second source/drain region 216.

According to embodiments, a bit line structure 240 extending lengthwise in the second horizontal direction (Y direction) may be formed on the first source/drain region 214. According to embodiments, the bit line structure 240 may include a direct contact 242, the bit line BL, a bit line capping layer 244, and bit line spacers 248.

According to embodiments, a plurality of direct contacts 242 may be arranged on a plurality of first source/drain regions 214, and the bit line BL may extend in the second horizontal direction (Y direction) over the plurality of direct contacts 242. According to embodiments, the bit line capping layer 244 may be disposed on the bit line BL. According to embodiments, the bit line spacers 248 may cover sidewalls of the direct contact 242, the bit line BL, and the bit line capping layer 244. For example, the bit line spacers 248 may contact sidewalls of the direct contact 242, the bit line BL, and the bit line capping layer 244.

According to embodiments, the direct contact 242 may include Si, Ge, W, WN, Co, Ni, Al, Mo, Ru, Ti, TiN, Ta, TaN, Cu, or a combination thereof. According to embodiments, the direct contact 242 may include doped polysilicon. According to embodiments, the bit line BL may include doped polysilicon, Ti, TiN, TiSiN, tungsten (W), WN, tungsten silicide (WSi), tungsten silicon nitride (WSiN), ruthenium (Ru), or a combination thereof. According to embodiments, the bit line capping layer 244 may include a silicon nitride layer.

According to embodiments, a first interlayer insulation layer 232 surrounding the bit line structures 240 may be disposed on the first semiconductor substrate 210. According to embodiments, first capacitor contacts 252 may penetrate through the first interlayer insulation layer 232 and may contact the second source/drain region 216. The first interlayer insulation layer 232 may contact side surfaces of the bit line structures 240 and the first capacitor contacts 252.

According to embodiments, a second interlayer insulation layer 234 may be disposed on the bit line structures 240 and the first interlayer insulation layer 232. According to embodiments, first landing pads 254 may penetrate through the second interlayer insulation layer 234 and may contact the first capacitor contacts 252. The second interlayer insulation layer 234 may contact side surfaces of the first landing pads 254.

According to embodiments, the first capacitor contacts 252 may include doped polysilicon. According to embodiments, the first landing pads 254 may include at least one from among metals like Ru, Ti, Ta, niobium (Nb), iridium (Ir), molybdenum (Mo), or W and metal nitrides like titanium nitride (TiN), tantalum nitride (TaN), niobium nitride (NbN), molybdenum nitride (MoN), and WN.

According to embodiments, first capacitor structures 260 may be disposed on the second interlayer insulation layer 234. According to embodiments, each of the first capacitor structures 260 may include a first lower electrode 262 electrically connected to the first capacitor contact 252 with the first landing pad 254 therebetween, a first capacitor dielectric layer 264 covering the first lower electrode 262, and a first upper electrode 266 spaced apart from the first lower electrode 262 with the first capacitor dielectric layer 264 therebetween. For example, the first capacitor dielectric layer 264 may contact the first lower electrode 262, and the first upper electrode 266 may contact the first capacitor dielectric layer 264. In addition, a first upper dielectric layer 236 may be disposed below the first capacitor dielectric layer 264 to be provided between the first capacitor dielectric layer 264 and the second interlayer insulation layer 234 and portions of the first landing pads 254. For example, the first upper dielectric layer 236 may include at least one material selected from the group consisting of ZrO, HfO, TiO, NbO, TaO, YO, SrO, BaSrTiO, ScO, and LaO.

According to embodiments, the first lower electrode 262 and the first upper electrode 266 may each include at least one material selected from among metals like Ru, Ti, Ta, Nb, Ir, Mo, and W, conductive metal nitrides like TiN, TaN, NbN, MoN, and WN, and conductive metal oxides like iridium oxide ($IrO_2$), ruthenium oxide ($RuO_2$), and strontium ruthenium oxide ($SrRuO_3$).

According to embodiments, the first capacitor dielectric layer 264 may include at least one material from among zirconium oxide, hafnium oxide, titanium oxide, niobium oxide, tantalum oxide, yttrium oxide, strontium titanium oxide, barium strontium titanium oxide, scandium oxide, and lanthanide oxide.

Figure 5A:
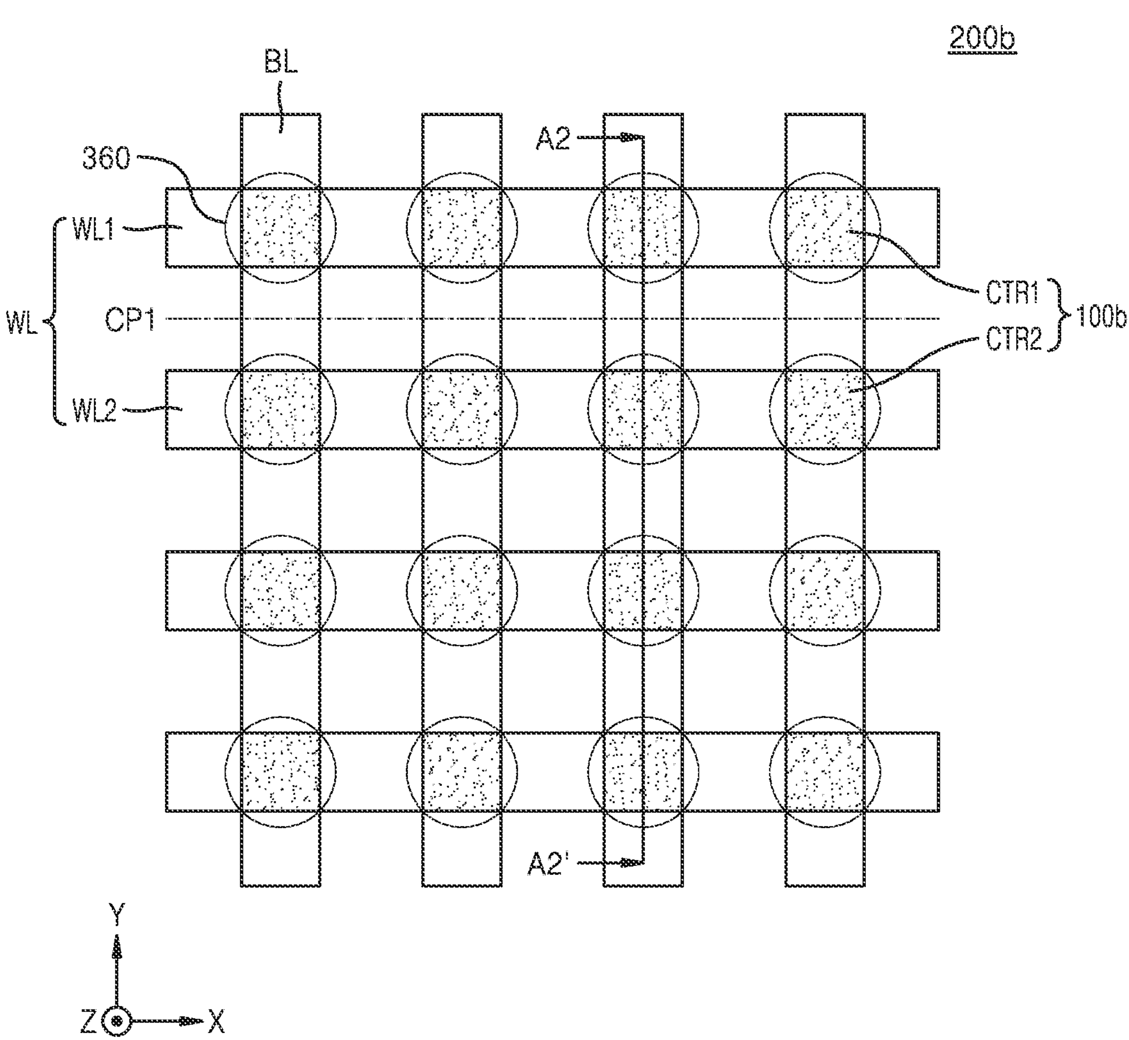
FIG. 5A is a layout diagram showing an integrated circuit device according to example embodiments.

FIG. 5A is a layout diagram showing a second integrated circuit device 200*b* according to example embodiments.

Figure 5B:
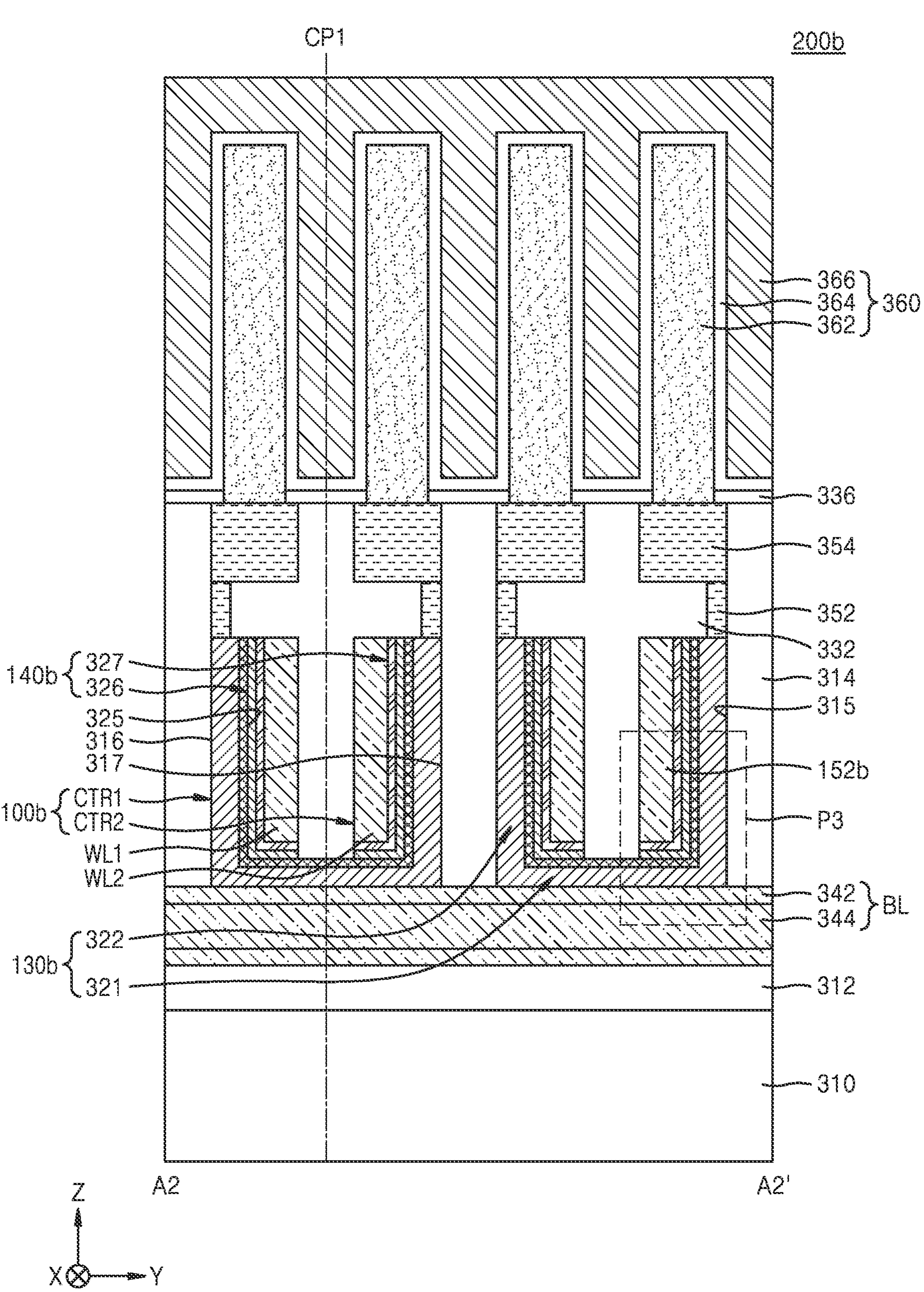
FIG. 5B is a cross-sectional view taken along a line A2-A2' of FIG. 5A.
Figure 5C:
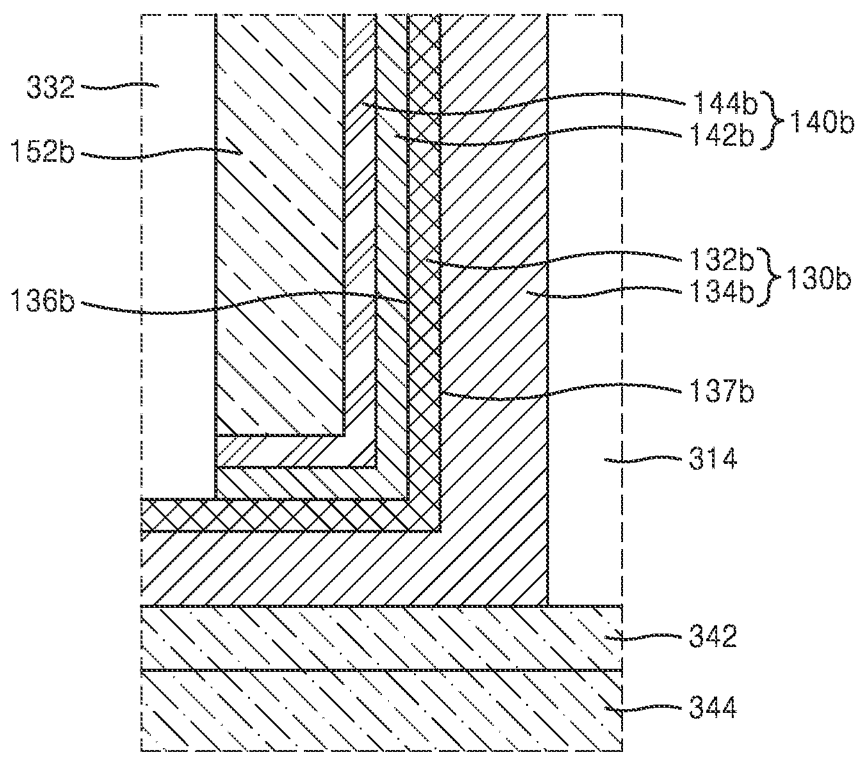
FIG. 5C is an enlarged view of a region P3 in FIG. 5B.

FIG. 5B is a cross-sectional view taken along a line A2-A2' of FIG. 5A. FIG. 5C is an enlarged view of a region P3 in FIG. 5B.

Referring to FIGS. 5A to 5C, the second integrated circuit device 200*b* may include a second transistor structure 100*b*. According to embodiments, the second transistor structure 100*b* may be a vertical transistor in which a channel extends in a vertical direction. Since a vertical transistor may occupy a smaller plane area than a planar transistor, the plane area of the memory cell MC may be reduced. Therefore, the degree of integration of the second integrated circuit device 200*b* may be increased.

According to embodiments, the plurality of word lines WL may extend lengthwise in parallel to one another in the first horizontal direction (X direction) on the second semiconductor substrate 310, and the plurality of bit lines BL may extend lengthwise in parallel to one another in the second horizontal direction (Y direction) crossing the first horizontal direction (X direction). According to embodiments, the plurality of word lines WL may be arranged over the plurality of bit lines BL, and a plurality of second transistor structures 100*b* may be formed at points where the plurality of word lines WL and the plurality of bit lines BL overlap each other in the vertical direction (Z direction).

According to embodiments, the plurality of word lines WL may include first word lines WL1 and second word lines WL2 alternately arranged in the second horizontal direction (Y direction), and the plurality of second transistor structures 100*b* may include first sub transistor structures CTR1 and second sub transistor structures CTR2 alternately arranged in the second horizontal direction (Y direction).

According to embodiments, a first sub transistor structure CTR1 and a second sub transistor structure CTR2 may have a mirror-symmetrical structure with respect to each other. For example, the first sub transistor structure CTR1 and the second sub transistor structure CTR2 may have a mirror-symmetric structure around a first central plane CP1 extending lengthwise in the first horizontal direction (X direction).

According to embodiments, a lower insulation layer 312 may be disposed on the second semiconductor substrate 310. According to embodiments, the second semiconductor substrate 310 may include silicon including monocrystalline silicon, polycrystalline silicon, or amorphous silicon. According to some other embodiments, the second semiconductor substrate 310 may include at least one selected from among Ge, SiGe, SiC, GaAs, InAs, and InP. According to some embodiments, the second semiconductor substrate 310 may include a conductive region, e.g., a well doped with an impurity or a structure doped with an impurity. According to embodiments, the lower insulation layer 312 may include an oxide layer, a nitride layer, or a combination thereof.

According to embodiments, the bit line BL extending lengthwise in the second horizontal direction (Y direction) may be disposed on the lower insulation layer 312. Here, the bit line BL may include the same material as the bit line BL of the first integrated circuit device 200*a*.

According to embodiments, the bit line BL of the second integrated circuit device 200*b* may include a conductive layer 344 and conductive barrier layers 342 arranged on the top surface and the bottom surface of the conductive layer 344. A bit line insulation layer (not shown) extending in the second horizontal direction (Y direction) may be disposed on a sidewall of the bit line BL. For example, the bit line insulation layer may fill the space between two bit lines BL adjacent to each other and have the same height as the bit lines BL.

According to embodiments, a mold layer 314 may be formed on the bit line BL and the bit line insulation layer. According to embodiments, the mold layer 314 may include a mold opening 315, and the second transistor structure 100*b* may be disposed in the mold opening 315.

According to embodiments, a second semiconductor layer 130*b* disposed on the inner wall of the mold opening 315 and having a semiconductor layer opening 325 may be disposed. The second semiconductor layer 130*b* may include a first portion 321 contacting the bit line BL at the bottom of the mold opening 315 and a second portion 322 connected to the first portion 321 and covering a first sidewall 316 and a second sidewall 317 of the mold opening 315. According to embodiments, the semiconductor layer opening 325 may be defined by the first portion 321 and the second portion 322 of the second semiconductor layer 130*b*. For example, the second semiconductor layer 130*b* may have a U-shaped vertical cross-section.

According to embodiments, a second dielectric layer 140*b* may be partially disposed on the inner wall of the semiconductor layer opening 325. According to embodiments, the second dielectric layer 140*b* may include a first dielectric structure 326 and a second dielectric structure 327 covering the second portion 322 of the second semiconductor layer 130*b*. For example, the first dielectric structure 326 and the second dielectric structure 327 may be arranged mirror-symmetrically with each other around the first central plane CP1. For example, the first dielectric structure 326 may be disposed on the first sidewall 316 of the mold opening 315 with a portion of the second portion 322 of the second semiconductor layer 130*b*, which covers the first sidewall 316 of the mold opening 315, therebetween. For example, the second dielectric structure 327 may be disposed on the second sidewall 317 of the mold opening 315 with a portion of the second portion 322 of the second semiconductor layer 130*b*, which covers the second sidewall 317 of the mold opening 315, therebetween. For example, each of the first dielectric structure 326 and the second dielectric structure 327 may partially cover the second portion 322 of the second semiconductor layer 130*b*. For example, the first dielectric structure 326 and the second dielectric structure 327 may be spaced apart from each other with an insulation structure 332, which has the first central plane CP1 therein, therebetween. For example, the first dielectric structure 326 may have an L-shaped vertical cross-section, and the second dielectric structure 327 may have a horizontally inverted L-shaped vertical cross-section.

According to embodiments, a first word line WL1 may be disposed on the first dielectric structure 326 and a second word line WL2 may be disposed on the second dielectric structure 327. In FIGS. 5B and 5C, a second gate electrode layer 152*b* disposed on the first dielectric structure 326 may correspond to the first word line WL1, and a second gate electrode layer 152*b* disposed on the second dielectric structure 327 may correspond to the second word line WL2. For example, the first word line WL1 and the second word line WL2 may be spaced apart from the second portion 322 of the second semiconductor layer 130*b* with the first dielectric structure 326 and the second dielectric structure 327 therebetween, respectively. According to embodiments, the first word line WL1 and the second word line WL2 may be spaced apart from each other with the insulation structure 332 therebetween.

According to embodiments, the second semiconductor layer 130*b* may include a second sub semiconductor layer 132*b* contacting the second dielectric layer 140*b* and a second main semiconductor layer 134*b* spaced apart from the second dielectric layer 140*b* with the second sub semiconductor layer 132*b* therebetween. According to embodiments, the second dielectric layer 140*b* may include a second sub dielectric layer 142*b* contacting the second sub semiconductor layer 132*b* and a second main dielectric layer 144*b* spaced apart from the second sub semiconductor layer 132*b* with the second sub dielectric layer 142*b* therebetween. According to embodiments, the second sub dielectric layer 142*b* may be disposed on a first surface 136*b* of the second sub semiconductor layer 132*b*, and the second main semiconductor layer 134*b* may be disposed on a second surface 137*b* of the second sub semiconductor layer 132*b*. For example, the second sub dielectric layer 142*b* may contact the first surface 136*b* of the second sub semiconductor layer 132*b*, and the second main semiconductor layer 134*b* may contact the second surface 137*b* of the second sub semiconductor layer 132*b*. According to embodiments, the first word line WL1 and the second word line WL2 may be arranged on the second main dielectric layer 144*b*. For example, the first word line WL1 and the second word line WL2 may contact the second main dielectric layer 144*b*.

According to embodiments, the word line WL, the second main dielectric layer 144*b*, the second sub dielectric layer 142*b*, the second sub semiconductor layer 132*b*, and the second main semiconductor layer 134*b* of the second integrated circuit device 200*b* may correspond to the gate electrode layer 152, the main dielectric layer 144, the sub dielectric layer 142, the sub semiconductor layer 132, and the main semiconductor layer 134 of the field effect transistor 100, respectively.

According to embodiments, a plurality of second capacitor contacts 352 may be formed on the second portion 322 of the second semiconductor layer 130*b*. According to embodiments, a first one of the second capacitor contacts 352 may contact the top surface of a portion of the second portion 322 of the second semiconductor layer 130*b* covering the first sidewall 316 of the mold opening 315 and a second one of the second capacitor contacts 352 may contact the top surface of a portion of the second portion 322 of the second semiconductor layer 130*b* covering the second sidewall 317 of the mold opening 315. According to embodiments, the plurality of second capacitor contacts 352 may be linearly arranged in the first horizontal direction (X direction) and the second horizontal direction (Y direction).

According to embodiments, a plurality of second landing pads 354 may be arranged on the second capacitor contacts 352, respectively. According to embodiments, the plurality of second landing pads 354 may at least partially overlap the plurality of second capacitor contacts 352 in the vertical direction (Z direction), respectively. According to embodiments, each second capacitor contact 352 and each second landing pad 354 may be surrounded by the mold layer 314 and the insulation structure 332. For example, the mold layer 314 and the insulation structure 332 may contact each of the second capacitor contacts 352 and each of the second landing pads 354.

According to embodiments, second capacitor structures 360 may be disposed on the mold layer 314 and the insulation structure 332. According to embodiments, each of the second capacitor structures 360 may include a second lower electrode 362 electrically connected to the second capacitor contact 352 with the second landing pad 354 therebetween, a second capacitor dielectric layer 364 covering the second lower electrode 362, and a second upper electrode 366 spaced apart from the second lower electrode 362 with the second capacitor dielectric layer 364 therebetween. For example, the second capacitor dielectric layer 364 may contact the second lower electrode 362, and the second upper electrode 366 may contact the second capacitor dielectric layer 364. In addition, a second upper dielectric layer 336 may be disposed below second capacitor dielectric layer 364 to be provided between the second capacitor dielectric layer 364 and the mold layer 314, the insulation structure 332, and portions of the second landing pads 354. For example, the second upper dielectric layer 336 may include an oxide layer, a nitride layer, or a combination thereof.

According to embodiments, the second lower electrode 362, the second capacitor dielectric layer 364, and the second upper electrode 366 of the second capacitor structure 360 may include the same materials as those constituting the first lower electrode 262, the first capacitor dielectric layer 264, and the first upper electrode 266 of the first integrated circuit device 200*a*, respectively.

Figure 6:
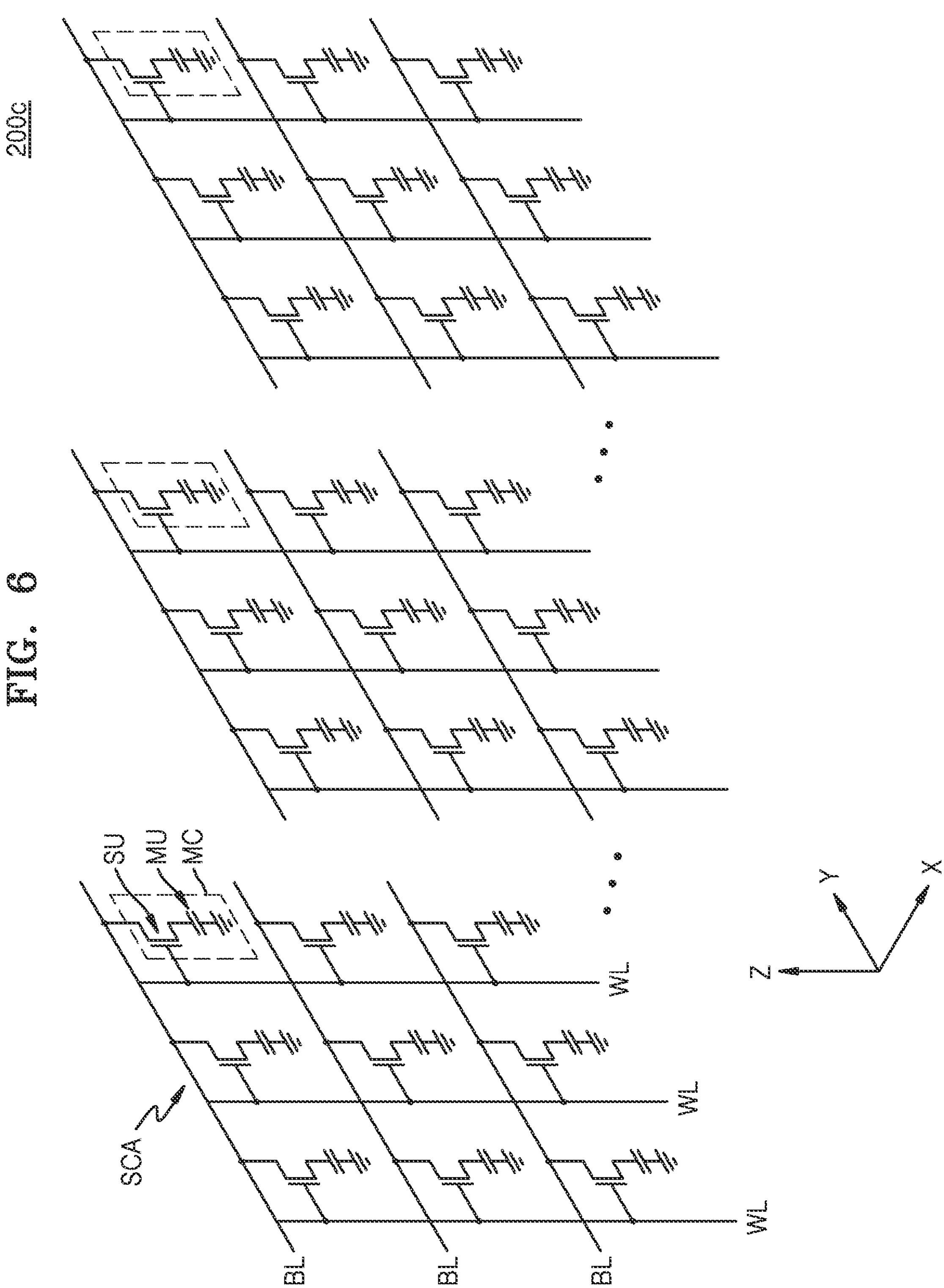
FIG. 6 is a schematic circuit diagram showing an integrated circuit device according to example embodiments.

FIG. 6 is a schematic circuit diagram for describing a third integrated circuit device 200*c* according to example embodiments.

Referring to FIG. 6, the third integrated circuit device 200*c* may have a structure in which memory cells are 3-dimensionally stacked. According to embodiments, a cell array of the third integrated circuit device 200*c* may include a plurality of sub cell arrays SCA. The plurality of sub cell arrays SCA may be arranged in the first horizontal direction (X direction). Each sub cell array SCA may include a plurality of memory cells MC, a plurality of bit lines BL, and a plurality of word lines WL. According to embodiments, each memory cell MC may include a memory unit MU and a selection unit SU.

For example, it may be understood that the plurality of memory cells MC, the plurality of bit lines BL, and the plurality of word lines WL perform the same functions as those of the components of the memory cell array shown in FIG. 3 respectively corresponding thereto.

According to embodiments, the plurality of bit lines BL may extend lengthwise in the second horizontal direction (Y direction) intersecting with the first horizontal direction (X direction) and may be arranged in parallel to one another in the vertical direction (Z direction). According to embodiments, the plurality of word lines WL may extend lengthwise in the vertical direction (Z direction) and may be arranged in parallel to one another in the second horizontal direction (Y direction).

Figure 7A:
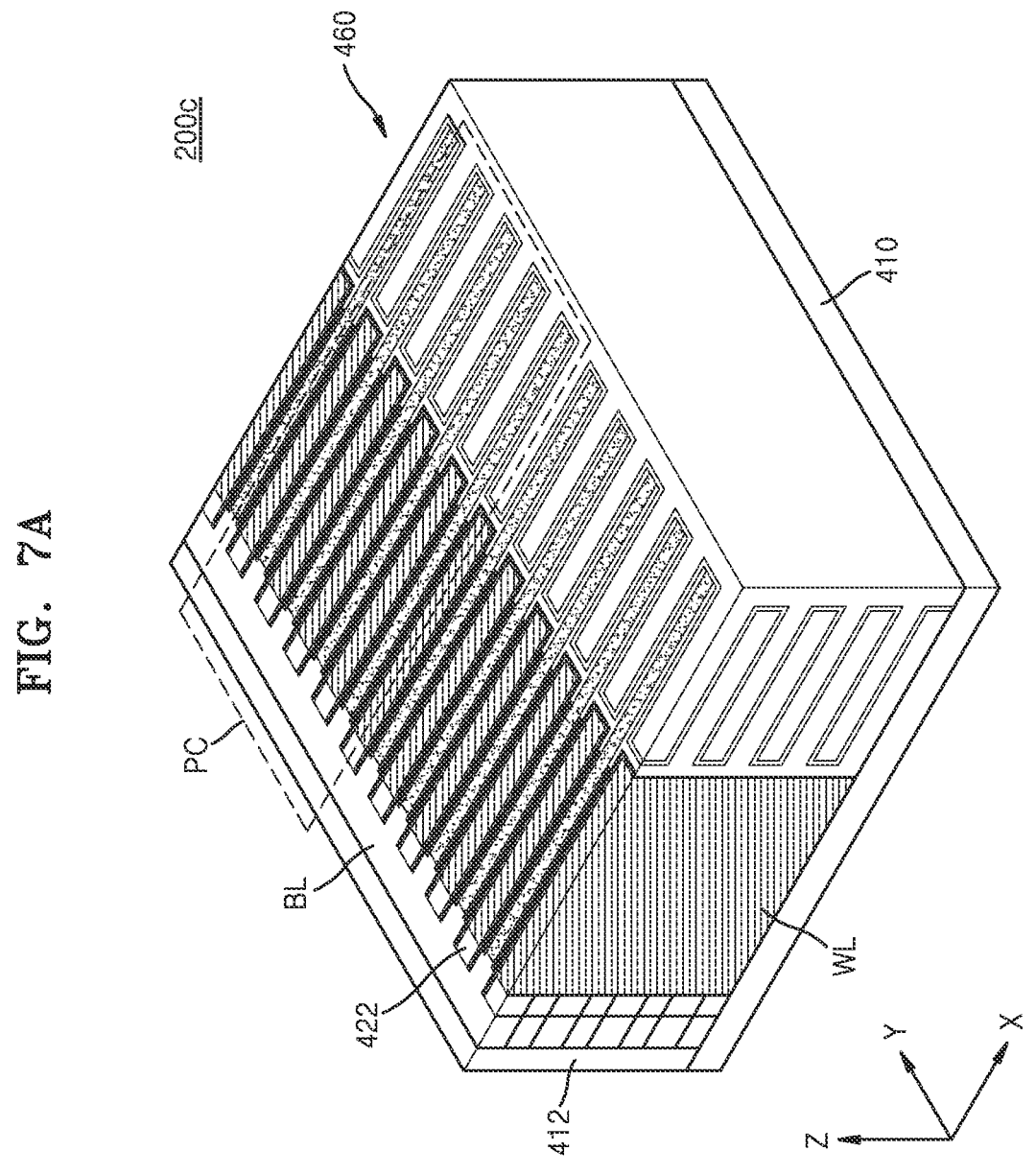
Figure 7B:
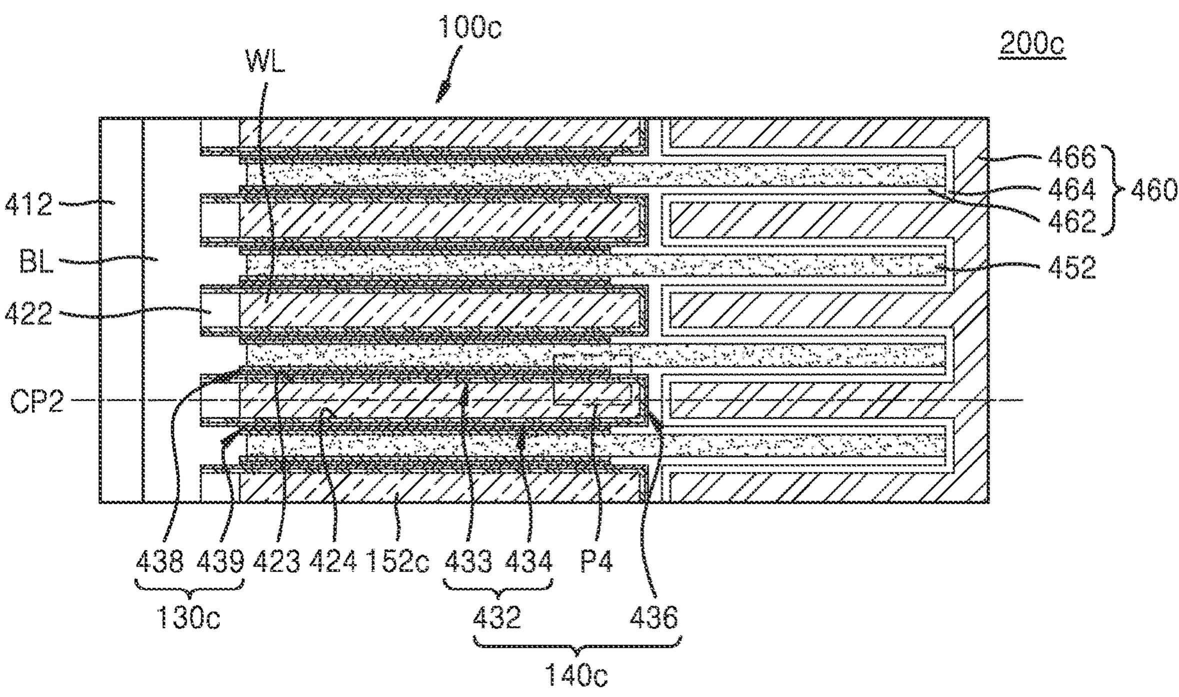
FIG. 7B is a horizontal cross-sectional view of a region PC in FIG. 7A.
Figure 7C:
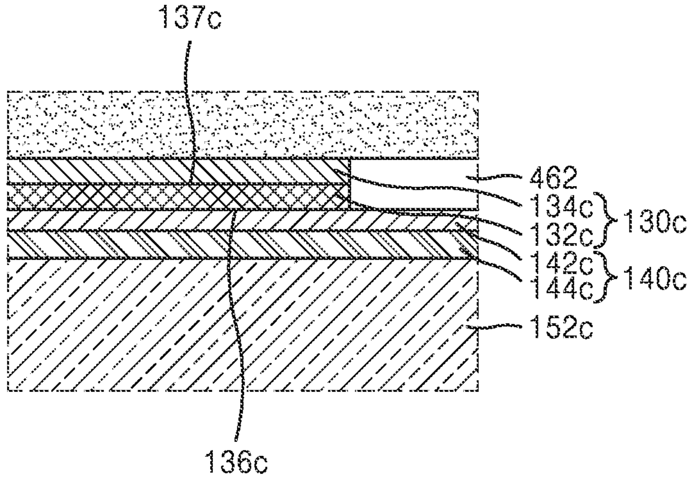
FIG. 7C is an enlarged view of a region P4 in FIG. 7B.

FIG. 7A is a perspective view of a third integrated circuit device 200*c* according to example embodiments. FIG. 7B is a horizontal cross-sectional view of a region PC in FIG. 7A. FIG. 7C is an enlarged view of a region P4 in FIG. 7B.

Referring to FIGS. 7A to 7C, one of the plurality of sub cell arrays SCA described with reference to FIG. 6 may be disposed on a third semiconductor substrate 410. According to embodiments, the third semiconductor substrate 410 may include silicon including monocrystalline silicon, polycrystalline silicon, or amorphous silicon. According to some other embodiments, the third semiconductor substrate 410 may include at least one selected from among Ge, SiGe, SiC, GaAs, InAs, and InP. According to some embodiments, the third semiconductor substrate 410 may include a conductive region, e.g., a well doped with an impurity or a structure doped with an impurity.

According to embodiments, a bit line insulation layer 412 having a surface perpendicular to the first horizontal direction (X direction) may be disposed on the third semiconductor substrate 410. According to embodiments, the plurality of bit lines BL may extend lengthwise in the second horizontal direction (Y direction) on one surface of the bit line insulation layer 412 and may be arranged in parallel to one another in the vertical direction (Z direction). According to embodiments, the bit line insulation layer 412 may include an oxide layer, a nitride layer, or a combination thereof.

According to embodiments, the plurality of word lines WL may be spaced apart from the plurality of bit lines BL in the first horizontal direction (X direction) and may extend lengthwise in the vertical direction (Z direction), on the third semiconductor substrate 410. According to embodiments, the plurality of word lines WL may be spaced apart from the plurality of bit lines BL with contact spacers 422 therebetween. According to embodiments, the contact spacers 422 may include silicon nitride.

According to embodiments, a third dielectric layer 140*c* partially penetrating each bit line BL in the first horizontal direction (X direction) and covering the plurality of word lines WL may be formed. According to embodiments, the plurality of contact spacers 422 and the plurality of word lines WL may be surrounded by a plurality of third dielectric layers 140*c*. According to embodiments, the plurality of word lines WL may be spaced apart from a third capacitor structure 460 in the first horizontal direction (X direction) with the third dielectric layer 140*c* therebetween.

According to embodiments, each word line WL may include a first surface 423 and a second surface 424 that face each other in the second horizontal direction Y. According to embodiments, the third dielectric layer 140*c* may include a first portion 432 that partially penetrates through the bit line BL and covers the first surface 423 and the second surface 424 of the word line WL and a second portion 436 in contact with the third capacitor structure 460.

According to embodiments, the first portion 432 of the third dielectric layer 140*c* may include a third portion 433 that covers the first surface 423 of the word line WL and a fourth portion 434 that covers the second surface 424 of the word line WL.

According to embodiments, a third semiconductor layer 130*c* may cover the first portion 432 of the third dielectric layer 140*c*. For example, the third semiconductor layer 130*c* may include a first semiconductor structure 438 covering the third portion 433 of the third dielectric layer 140*c* and a second semiconductor structure 439 covering the fourth portion 434 of the third dielectric layer 140*c*. According to embodiments, the first semiconductor structure 438 and the second semiconductor structure 439 may be arranged mirror-symmetrically with respect to each other around a second central plane CP2 extending in the first horizontal direction (X direction).

According to embodiments, the third semiconductor layer 130*c* may include a third sub semiconductor layer 132*c* contacting the third dielectric layer 140*c* and a third main semiconductor layer 134*c* spaced apart from the third dielectric layer 140*c* with the third sub semiconductor layer 132*c* therebetween.

According to embodiments, the third dielectric layer 140*c* may include a third sub dielectric layer 142*c* contacting the third sub semiconductor layer 132*c* and a third main dielectric layer 144*c* spaced apart from the third sub semiconductor layer 132*c* with the third sub dielectric layer 142*c* therebetween. According to embodiments, the third sub dielectric layer 142*c* may be disposed on a first surface 136*c* of the third sub semiconductor layer 132*c*, and the third main semiconductor layer 134*c* may be disposed on a second surface 137*c* of the third sub semiconductor layer 132*c*. According to embodiments, the third gate electrode layer 152*c* may be disposed on the third main dielectric layer 144*c*. The third gate electrode layer 152*c* in FIG. 7*c* may correspond to the word line WL in FIG. 7*b*. For example, the third gate electrode layer 152*c* may contact the third main dielectric layer 144*c*.

According to embodiments, the third gate electrode layer 152*c*, the third main dielectric layer 144*c*, the third sub dielectric layer 142*c*, the third sub semiconductor layer 132*c*, and the third main semiconductor layer 134*c* of the third integrated circuit device 200*c* may correspond to the gate electrode layer 152, the main dielectric layer 144, the sub dielectric layer 142, the sub semiconductor layer 132, and the main semiconductor layer 134 of the field effect transistor 100, respectively.

According to embodiments, a plurality of third semiconductor layers 130*c* covering the plurality of word lines WL may be spaced apart from one another through a channel isolation insulation layer 452. For example, the channel isolation insulation layer 452 may cover the third main semiconductor layer 134*c*.

According to embodiments, the third capacitor structure 460 may include a first electrode 462 contacting the third dielectric layer 140*c* at the second portion 436 of the third dielectric layer 140*c*, a third capacitor dielectric layer 464 covering the first electrode 462, and a second electrode 466 spaced apart from the first electrode 462 with the third capacitor dielectric layer 464 therebetween.

According to embodiments, the first electrode 462, the third capacitor dielectric layer 464, and the second electrode 466 of the third capacitor structure 460 may include the same materials as those constituting the first lower electrode 262, the first capacitor dielectric layer 264, and the first upper electrode 266 of the first integrated circuit device 200*a*, respectively.

While the inventive concept has been particularly shown and described with reference to embodiments thereof, it will be understood that various changes in form and details may be made therein without departing from the spirit and scope of the following claims.

What is claimed is:

1. A field effect transistor comprising:

a gate electrode layer;

an oxide semiconductor layer including gallium (Ga) and at least one metal element selected from indium (In) and zinc (Zn); and a dielectric layer between the gate electrode layer and the oxide semiconductor layer, wherein the oxide semiconductor layer comprises a sub semiconductor layer in contact with the dielectric layer and a main semiconductor layer spaced apart from the dielectric layer with the sub semiconductor layer therebetween, wherein the sub semiconductor layer has a first Ga content, wherein the first Ga content of the sub semiconductor layer is greater than contents of other metal elements included in the sub semiconductor layer and decreases as a distance from a first surface of the sub semiconductor layer increases, the first surface being in contact with the dielectric, and wherein the first Ga content is at a highest value at the first surface of the sub semiconductor layer and at a lowest value at a second surface of the sub semiconductor layer, the second surface being opposite the first surface.

2. The field effect transistor of claim 1, wherein the main semiconductor layer has a second Ga content, and wherein the first Ga content of the sub semiconductor layer is greater than the second Ga content of the main semiconductor layer.

3. The field effect transistor of claim 2, wherein the second Ga content of the main semiconductor layer is constant regardless of a thickness of the main semiconductor layer.

4. The field effect transistor of claim 1, wherein the sub semiconductor layer further comprises Zn and has a first Zn content, and wherein the first Zn content of the sub semiconductor layer is less than contents of other metal elements included in the sub semiconductor layer.

5. The field effect transistor of claim 1, wherein the sub semiconductor layer further comprises Zn and has a first Zn content, wherein the main semiconductor layer further comprises Zn and has a second Zn content, and wherein the second Zn content of the main semiconductor layer is greater than the first Zn content of the sub semiconductor layer.

6. The field effect transistor of claim 1, wherein the dielectric layer comprises a sub dielectric layer in contact with the sub semiconductor layer and a main dielectric layer spaced apart from the sub semiconductor layer with the sub dielectric layer therebetween, and wherein at least one of the sub dielectric layer and the main dielectric layer comprises a metal oxide.

7. The field effect transistor of claim 6, wherein the sub dielectric layer and the main dielectric layer each comprise a metal oxide, and wherein metal-oxygen (M-O) bond dissociation energy of the sub dielectric layer is less than M-O bond dissociation energy of the main dielectric layer.

8. The field effect transistor of claim 6, wherein the sub dielectric layer comprises aluminum oxide.

9. The field effect transistor of claim 6, wherein the main dielectric layer comprises at least one material selected from among hafnium oxide, zirconium oxide, lanthanum oxide, titanium oxide, tantalum oxide, and yttrium oxide.

10. An integrated circuit device comprising:

a substrate having a plurality of active regions;

transistor structures formed on the substrate and arranged in a plurality of word line trenches extending lengthwise in a first horizontal direction parallel to a top surface of the substrate; and a plurality of bit line structures formed on the substrate and extending lengthwise in a second horizontal direction, which is parallel to the top surface of the substrate and intersects with the first horizontal direction, wherein each of the transistor structures comprises:

a gate electrode layer;

an oxide semiconductor layer including gallium (Ga) and at least one metal element selected from indium (In) and zinc (Zn); and a dielectric layer between the gate electrode layer and the oxide semiconductor layer, wherein the oxide semiconductor layer comprises a sub semiconductor layer, which is in contact with the dielectric layer and has a first Ga content, and a main semiconductor layer, which is spaced apart from the dielectric layer with the sub semiconductor layer therebetween and has a second Ga content, wherein the first Ga content is greater than contents of other metal elements included in the sub semiconductor layer and decreases as a distance from a first surface of the sub semiconductor layer increases the first surface being in contact with the dielectric layer, and wherein the first Ga content is at a highest value at the first surface of the sub semiconductor layer and at a lowest value at a second surface of the sub semiconductor layer, the second surface being opposite the first surface.

11. The integrated circuit device of claim 10, wherein the first Ga content of the sub semiconductor layer is greater than the second Ga content of the main semiconductor layer.

12. The integrated circuit device of claim 10, wherein the sub semiconductor layer further comprises Zn and has a first Zn content, wherein the main semiconductor layer further comprises Zn and has a second Zn content, and wherein the first Zn content of the sub semiconductor layer is less than the second Zn content of the main semiconductor layer.

13. The integrated circuit device of claim 12, wherein the first Zn content of the sub semiconductor layer increases as the distance from the first surface of the sub semiconductor layer increases.

14. The integrated circuit device of claim 10, wherein the dielectric layer comprises a sub dielectric layer, which is in contact with the sub semiconductor layer, and a main dielectric layer, which contacts the gate electrode layer and is spaced apart from the sub semiconductor layer with the sub dielectric layer therebetween, wherein the sub dielectric layer and the main dielectric layer each comprise a metal oxide, and wherein metal-oxygen (M-O) bond dissociation energy of the sub dielectric layer is less than M-O bond dissociation energy of the main dielectric layer.

15. The integrated circuit device of claim 14, wherein the sub dielectric layer comprises aluminum oxide.

16. The integrated circuit device of claim 14, wherein the main dielectric layer comprises at least one material selected from among hafnium oxide, zirconium oxide, lanthanum oxide, titanium oxide, tantalum oxide, and yttrium oxide.

17. An integrated circuit device comprising:

a bit line extending in a first horizontal direction on a substrate;

a word line extending in a second horizontal direction crossing the first horizontal direction over the bit line;

an oxide semiconductor layer comprising gallium (Ga) and at least one metal element selected from indium (In) and zinc (Zn), extending in a vertical direction over the bit line, and spaced apart from the word line with a dielectric layer therebetween;

a landing pad disposed on the oxide semiconductor layer; and a capacitor structure disposed on the landing pad, wherein the dielectric layer comprises a sub dielectric layer in contact with the oxide semiconductor layer and a main dielectric layer in contact with the word line, wherein the oxide semiconductor layer comprises a sub semiconductor layer, which is in contact with the sub dielectric layer, and a main semiconductor layer, which surrounds the sub semiconductor layer and is in contact with the bit line, wherein the sub semiconductor layer has a first Ga content and the main semiconductor layer has a second Ga content, wherein the first Ga content of the sub semiconductor layer is greater than contents of other metal elements included in the sub semiconductor layer and decreases as a distance from a first surface of the sub semiconductor layer increases, the first surface being in contact with the sub dielectric layer, and wherein the first Ga content is at a highest value at the first surface of the sub semiconductor layer and at a lowest value at a second surface of the sub semiconductor layer, the second surface being opposite the first surface.

18. The integrated circuit device of claim 17, wherein the sub semiconductor layer further comprises Zn and has a first Zn content, and wherein the first Zn content of the sub semiconductor layer increases as the distance from the first surface of the sub semiconductor layer increases.

19. The integrated circuit device of claim 17, wherein the main semiconductor layer further comprises In and Zn, and has a second In content and a second Zn content, and wherein the second In content, the second Ga content, and the second Zn content of the main semiconductor layer are equal to one another.

20. The integrated circuit device of claim 17, wherein the sub dielectric layer comprises aluminum oxide.

* * * * *